US010170583B2

(12) United States Patent
Cheng et al.

(10) Patent No.: US 10,170,583 B2
(45) Date of Patent: Jan. 1, 2019

(54) FORMING A GATE CONTACT IN THE ACTIVE AREA

(71) Applicants: International Business Machines Corporation, Armonk, NY (US); GlobalFoundries, Inc., Grand Cayman (KY)

(72) Inventors: Kangguo Cheng, Schenectady, NY (US); Ruilong Xie, Schenectady, NY (US); Tenko Yamashita, Schenectady, NY (US)

(73) Assignees: INTERNATIONAL BUSINESS MACHINES CORPORATION, Armonk, NY (US); GLOBALFOUNDRIES, INC., Grand Cayman (KY)

( * ) Notice: Subject to any disclaimer, the term of this patent is extended or adjusted under 35 U.S.C. 154(b) by 22 days.

(21) Appl. No.: 15/244,067

(22) Filed: Aug. 23, 2016

(65) Prior Publication Data
US 2017/0054004 A1    Feb. 23, 2017

Related U.S. Application Data

(62) Division of application No. 14/829,843, filed on Aug. 19, 2015.

(51) Int. Cl.
*H01L 29/66* (2006.01)
*H01L 29/78* (2006.01)
(Continued)

(52) U.S. Cl.
CPC .... *H01L 29/66553* (2013.01); *H01L 21/0228* (2013.01); *H01L 21/02178* (2013.01);
(Continued)

(58) Field of Classification Search
CPC ............. H01L 29/66545; H01L 29/785; H01L 29/66795; H01L 21/76897; H01L 29/6656; H01L 29/665; H01L 29/6681
See application file for complete search history.

(56) References Cited

U.S. PATENT DOCUMENTS 9,190,486 B2 * 11/2015 Xie .................... H01L 29/66545
2012/0119307 A1 * 5/2012 Li ...................... H01L 21/76816
                                                                  257/410
(Continued)

OTHER PUBLICATIONS

List of IBM Patents or Patent Applications Treated as Related; (Appendix P), Filed Jul. 21, 2017; 2 pages.

*Primary Examiner* — Joseph C Nicely
*Assistant Examiner* — David Goodwin
(74) *Attorney, Agent, or Firm* — Cantor Colburn LLP; Vasken Alexanian (57) ABSTRACT

A method of making a semiconductor device includes patterning a fin in a substrate; forming a gate between source/drain regions over the substrate, the gate having a dielectric spacer along a sidewall; removing a portion of the dielectric spacer and filling with a metal oxide to form a spacer having a first spacer portion and a second spacer portion; forming a source/drain contact over at least one of the source/drain regions; recessing the source/drain contact and forming a via contact over the source/drain contact; and forming a gate contact over the gate, the gate contact having a first gate contact portion contacting the gate and a second gate contact portion positioned over the first gate contact portion; wherein the first spacer portion isolates the first gate contact portion from the source/drain contact, and the second spacer portion isolates the second gate contact portion from the source/drain contact.

10 Claims, 13 Drawing Sheets

(51) Int. Cl.
*H01L 29/417* (2006.01)
*H01L 21/02* (2006.01)
*H01L 21/28* (2006.01)
*H01L 21/768* (2006.01)

(52) U.S. Cl.
CPC .. *H01L 21/02181* (2013.01); *H01L 21/28079* (2013.01); *H01L 21/76897* (2013.01); *H01L 29/41791* (2013.01); *H01L 29/6653* (2013.01); *H01L 29/66545* (2013.01); *H01L 29/66795* (2013.01); *H01L 29/785* (2013.01)

(56) References Cited

U.S. PATENT DOCUMENTS

| | | | |
|---|---|---|---|
| 2015/0069532 A1* | 3/2015 | Xie | H01L 29/66545 257/410 |
| 2016/0190339 A1* | 6/2016 | Xie | H01L 29/66545 257/347 |
| 2016/0336270 A1* | 11/2016 | Chen | H01L 21/76805 |
| 2017/0053997 A1 | 2/2017 | Cheng et al. | |

\* cited by examiner

FORMING A GATE CONTACT IN THE ACTIVE AREA

This application is a divisional of and claims priority from U.S. patent application Ser. No. 14/829,843, filed on Aug. 19, 2015, entitled "FORMING A GATE CONTACT IN THE ACTIVE AREA", the entire contents of which are incorporated herein by reference.

BACKGROUND

The present invention relates to metal-oxide-semiconductor field-effect transistors (MOSFET), and more specifically, to gate contacts in MOSFETs.

The MOSFET is a transistor used for amplifying or switching electronic signals. The MOSFET has a source, a drain, and a metal oxide gate electrode. The metal gate is electrically insulated from the main semiconductor n-channel or p-channel by a layer of insulating material, for example, silicon dioxide or glass, which makes the input resistance of the MOSFET relatively high. The gate voltage controls whether the path from drain to source is an open circuit ("off") or a resistive path ("on").

Generally, the gate contact (also called the CB) is formed over shallow trench isolation (STI) regions to avoid shorting between the gate contact and the source/drain contact (also called the TS). However, placing the gate contact over the active area (also called the RX), or the semiconductor regions where the source/drain regions are formed, may be beneficial for increasing the integration density and reduce device scaling.

SUMMARY

According to an embodiment of the present invention, a method of making a semiconductor device includes patterning a fin in a substrate; forming a gate between source/drain regions over the substrate, the gate having a dielectric spacer along a sidewall; removing a portion of the dielectric spacer and filling with a metal oxide to form a spacer having a first spacer portion and a second spacer portion; forming a source/drain contact over at least one of the source/drain regions; recessing the source/drain contact and forming a via contact over the source/drain contact; and forming a gate contact over the gate, the gate contact having a first gate contact portion contacting the gate and a second gate contact portion positioned over the first gate contact portion; wherein the first spacer portion isolates the first gate contact portion from the source/drain contact, and the second spacer portion isolates the second gate contact portion from the source/drain contact.

In another embodiment, a method of making a semiconductor device includes patterning a fin in a substrate; forming a gate between source/drain regions over the substrate, the gate having a dielectric spacer along a sidewall; removing a portion of the dielectric spacer and filling with a metal oxide to form a spacer, the spacer having a first spacer portion and a second spacer portion; recessing the gate and depositing a dielectric cap over the gate; forming a source/drain contact over at least one of the source/drain regions, the source/drain contact contacting the spacer and the dielectric spacer; forming a via contact over the source/drain contact; and removing the dielectric cap and forming a gate contact over the gate, the gate contact having a first gate contact portion contacting the gate and a second gate contact portion positioned over the first gate contact portion; wherein the first spacer portion isolates the first gate contact portion from the source/drain contact, and the second spacer portion isolates the second gate contact portion from the source/drain contact.

Yet, in another embodiment, a semiconductor device includes a fin patterned in a substrate; a gate contact disposed over a gate positioned over the substrate, the gate contact having a first gate contact portion contacting the gate and a second gate contact portion positioned over the first portion; a source/drain contact disposed over a source/drain region positioned over the substrate; and a spacer between the source/drain contact and the gate contact, the spacer having a first spacer portion that isolates the first gate contact portion from the source/drain contact and a second spacer portion that isolates the second gate contact portion from the source/drain contact.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-1C illustrate a comparative example of a semiconductor device with a gate contact over the active area, in which;

FIGS. 2A-2C illustrate an exemplary semiconductor device according to embodiments of the present invention, in which:

FIGS. 3A-13B illustrate an exemplary method of making the semiconductor device shown in FIGS. 2A-2C according to embodiments of the present invention, in which:

DETAILED DESCRIPTION

Figure 1A:
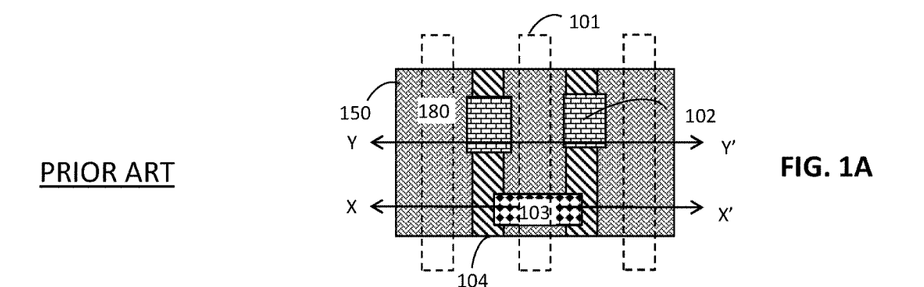
FIG. 1A is a top view of the semiconductor device.
Figure 1B:
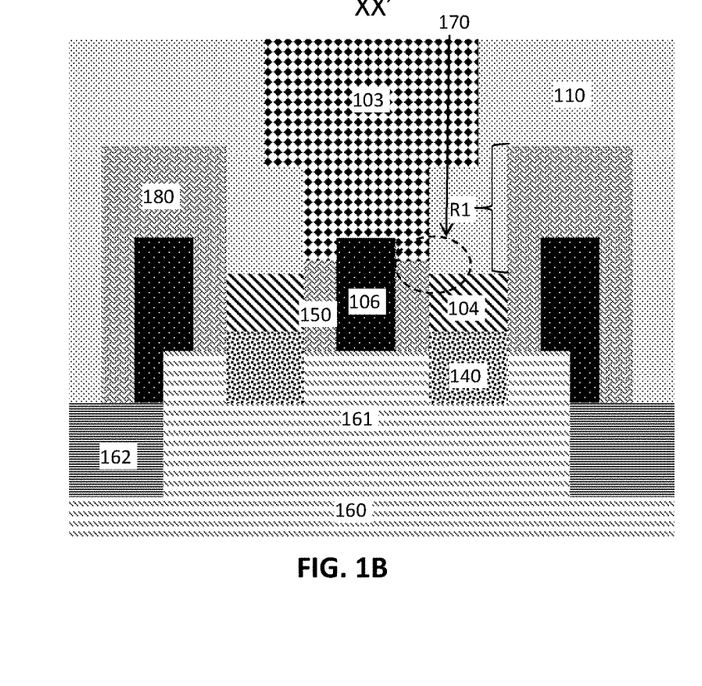
FIGS. 1B and 1C are cross-sectional side views through the XX' and YY' axes, respectively, of FIG. 1A.
Figure 1C:
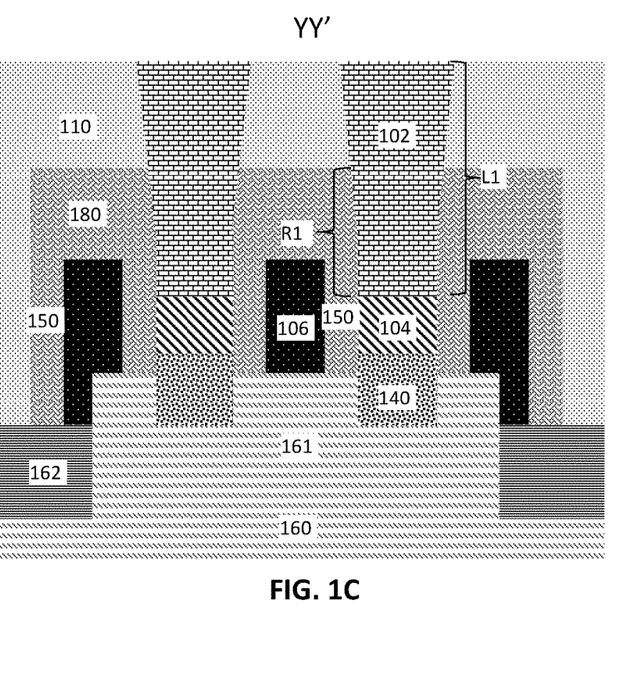

One method for placing a gate contact over the active area of a semiconductor device involves forming a deep recess for the source/drain contact. However, deep recesses in the source/drain contact make it more challenging to align the via contact over the source/drain contact. Further, such designs may induce shorting between the gate contact and the source/drain contact, as shown in FIGS. 1A-1C below.

Accordingly, embodiments of the present invention provide methods of making semiconductor devices with gate contacts over active areas using shallow source/drain contacts. Shallow source/drain contacts enable accessible via contact alignment. The gate contact is isolated from the source/drain contacts by a spacer with two portions. A first portion isolates the gate conductor from the source/drain contacts, and a second portion isolates the upper gate contact portion from the source/drain contacts. Embodiments of the inventive semiconductor devices and methods provide advantages of forming gate contacts over active areas that avoid gate contact to source/drain contact shorting and allow for easier via contact formation over the source/drain contact. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Turning now to the Figures, FIGS. 1A-1C illustrate a comparative example of a semiconductor device with a gate contact over the active area. FIG. 1A is a top view of the semiconductor device. FIGS. 1B and 1C are cross-sectional side views through the XX' and YY' axes, respectively, of FIG. 1A. For simplicity, FIG. 1A does not show the ILD layer 110 or STI regions 162 shown in FIGS. 1B and 1C.

Fins 161 are patterned in a substrate 160 including STI regions 162. Metal gates 106 surrounded by dielectric spacers 150 are disposed over the fin 161. In FIG. 1A, the metal gates 106 are indicated by open dashed boxes 101, which are beneath dielectric caps 180 as shown in FIGS. 1B and 1C. Source/drain contacts 104 are over source/drain regions 140. A gate contact 103 is disposed over the metal gate 106. Via contacts 102 forming the active area are disposed over the source/drain contacts 104 as shown in FIG. 1C. The source/drain contacts 104 are formed in a deep recess (R1) below the level of the dielectric spacer 150 material to avoid contact (and shorting) with the source/drain contact 104. The deep recess (R1) increases the length (L1) of the via contact 102. However, even with the source/drain contact 104 positioned within the deep recess (R1), shorting may still occur in region 170 shown in FIG. 1B due to the relatively short distance between the source/drain contact 104 and the gate contact 103.

Figures 2A, 2B, 2C:
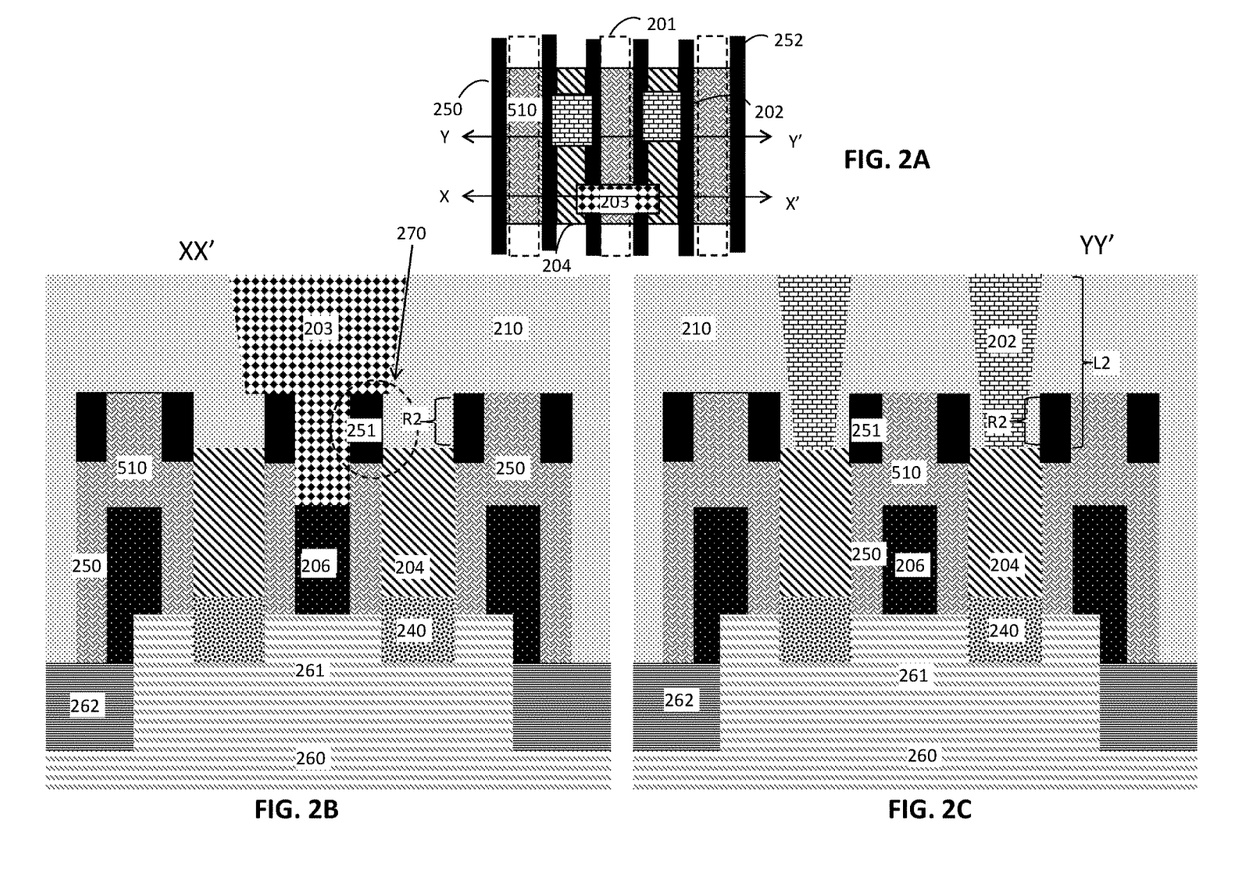
FIG. 2A is a top view of the semiconductor device.
FIGS. 2B and 2C are cross-sectional side views through the XX' and YY' axes, respectively, of FIG. 2A.

Accordingly, FIGS. 2A-2C illustrate an exemplary semiconductor device according to embodiments of the present invention, which alleviate the risk of shorting. FIGS. 2A-2C are described in further detail in FIGS. 3A-13B.

FIG. 2A is a top view of the semiconductor device. FIGS. 2B and 2C are cross-sectional side views through the XX' and YY' axes, respectively, of FIG. 2A. For simplicity, FIG. 2A does not show the ILD layer 210 or STI regions 262 shown in FIGS. 2B and 2C.

Metal gates 206 surrounded by dielectric spacers 250 are formed over fins 261 patterned in a substrate 260. In FIG. 2A, the metal gates 206 are indicated by open dashed boxes 201, which are beneath dielectric caps 510. Source/drain contacts 204 are formed over source/drain regions 240. A gate contact 203 is formed over the metal gate 206. Via contacts 202 forming the active area are formed over the source/drain contacts 204. Spacers 251 formed of an insulating metal oxide material are positioned between the gate contact 203 and the source/drain contact 204. The spacers 251 prevent shorting in the region 270 between the gate contact 203 and the source/drain contact 204. The source/drain contacts 204 are formed in a shallow recess (R2), which means that the length (L2) of the contact via 202 is shorter and more easily aligned with the source/drain contact to form the active area. At least a portion of the via contact 202 is more narrow than the source/drain contact 204.

Figure 3A:
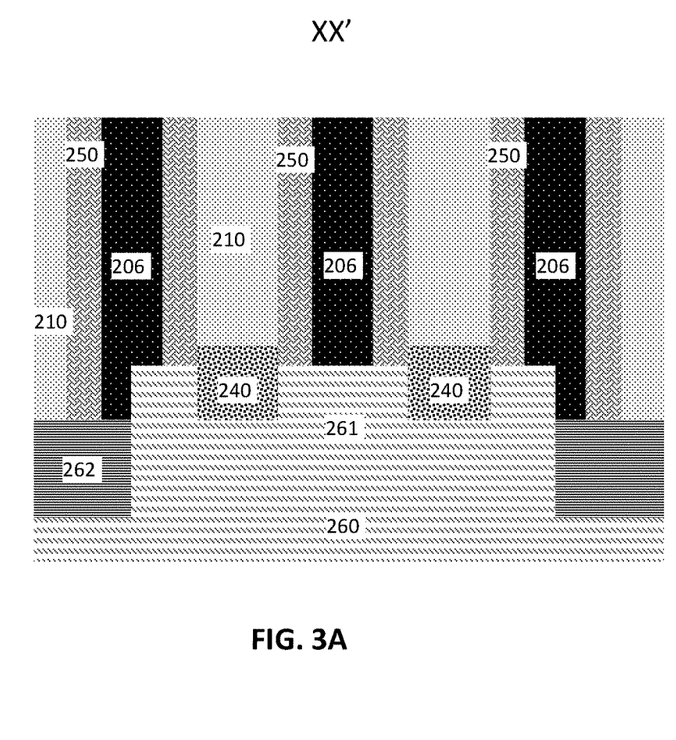
FIG. 3A illustrates a cross-sectional side view through the XX' axis of FIG. 2A showing metal gates over fins before forming a gate contact.

FIGS. 3A-13B illustrate an exemplary method of making the semiconductor device shown in FIGS. 2A-2C according to embodiments of the present invention. FIG. 3A illustrates a cross-sectional side view through the XX' axis of FIG. 2A. FIG. 3A shows metal gates 206 disposed over fins 261 before forming the gate contact 203. The fins 261 are patterned in a substrate 260. Non-limiting examples of suitable substrate 260 materials include silicon, silicon dioxide, aluminum oxide, sapphire, germanium, gallium arsenide, an alloy of silicon and germanium, indium phosphide, or any combination thereof. Other examples of suitable substrates include silicon-on-insulator (SOI) substrates with buried oxide (BOX) layers. The thickness of the substrate 260 is not intended to be limited. In one aspect, the thickness of the substrate 260 is in a range from about 10 micrometers (μm) to about 1 millimeter (mm). In another aspect, the thickness of the substrate 260 is in a range from about 500 μm to about 800 μm.

A STI process is performed to form the STI regions 262. The STI regions 262 are isolation regions formed by etching trenches in the substrate 260 and then filling the trenches with, for example, silicon oxide. Alternatively, the trenches may be lined with a silicon oxide liner formed by a thermal oxidation process and then filled with additional silicon oxide or another material.

To form the metal gates 206, initially, "dummy gates" (not shown) are formed over the fins 261. The dummy gates are filled with a suitable replacement gate material, for example, amorphous silicon (polysilicon). A hard mask material, for example, silicon nitride (SiN), SiOCN, or SiBCN, is deposited over the dummy gates. An etching process, for example, reactive ion etching (RIE) is performed to form dielectric spacers 250 surrounding the dummy gates, along the gate sidewall. The dielectric spacer material is deposited by a deposition process, for example, chemical vapor deposition (CVD) or physical vapor deposition (PVD). The thickness of the dielectric spacers 250 is not intended to be limited. In one aspect, the thickness of the dielectric spacers 250 is in a range from about 3 nanometers (nm) to about 30 nm. In another aspect, the thickness of the dielectric spacers 250 is in a range from about 5 nm to about 10 nm.

Source/drain regions 240 are formed by performing an epitaxial growth process over the fin 261. The epitaxial growth process deposits a crystalline material layer onto the crystalline substrate 260 beneath. The underlying substrate 260 acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon may be doped during deposition by adding a dopant or impurity. The silicon may be doped with an n-type dopant (e.g., phosphorus) or a p-type dopant (e.g., boron), depending on the type of transistor.

The thickness of the source/drain regions 240 is not intended to be limited. In one aspect, the thickness of the source/drain regions 240 is in a range from about 10 nm to about 80 nm. In another aspect, the thickness of the source/drain regions 240 is in a range from about 15 nm to about 30 nm.

The ILD layer 210 is formed by depositing a blanket layer of a low-k dielectric oxide material around the dummy gates within the dielectric spacers 250. Non-limiting examples of suitable low-k dielectric materials include a spin-on-glass, a flowable oxide, a high density plasma oxide, borophosphosilicate glass (BPSG), or any combination thereof. The ILD layer 210 material is deposited by a suitable deposition process, including, but not limited to CVD, PVD, plasma enhanced CVD, atomic layer deposition (ALD), evaporation, chemical solution deposition, or like processes.

The replacement gate material is removed from the dummy gates and replaced with conductive gate materials to form the metal gates 206. A high-k dielectric material may be deposited into the dummy gates to form a high-k liner. The high-k dielectric material may be a dielectric material having a dielectric constant, for example, greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Other non-limiting examples of suitable high-k dielectric materials include $HfO_2$, $ZrO_2$, $Al_2O_3$, $TiO2$, $La_2O_3$, $SrTiO_3$, $LaAlO_3$, $Y_2O_3$, a pervoskite oxide, or any combination thereof. The high-k dielectric material layer may be formed by known deposition processes, for example, CVD, plasma-enhanced chemical vapor deposition (PECVD), ALD, evaporation, PVD, chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

A conductive gate metal is deposited over the high-k dielectric material. Non-limiting examples of suitable conductive metals include aluminum (Al), platinum (Pt), gold (Au), tungsten (W), titanium (Ti), or any combination thereof. The conductive metal may be deposited by a known deposition process, for example, CVD, PECVD, PVD, plating, thermal or e-beam evaporation, and sputtering. A planarization process, for example, chemical mechanical planarization (CMP), is performed to polish the surface of the conductive gate metal.

Figure 3B:
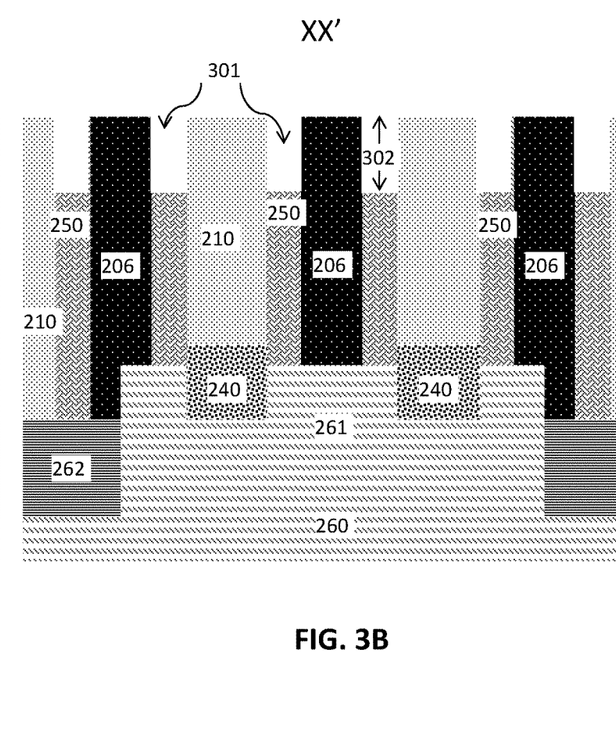
FIG. 3B is a cross-sectional side view through the XX' axis after recessing the gate dielectric spacers.

FIG. 3B is a cross-sectional side view after recessing the dielectric spacers 250. The spacer recesses 301 may be formed using a dry etching process, for example, RIE, to remove a portion of the dielectric spacer 250 material on opposing sides of the metal gates 206. The spacer recesses may be recessed to a depth 302 that may generally vary. In one aspect, the spacers 250 are recessed to a depth 302 in a range from about 5 nm to about 70 nm. In another aspect, the spacers 250 are recessed to a depth 302 in a range from about 15 nm to about 30 nm.

Figure 4A:
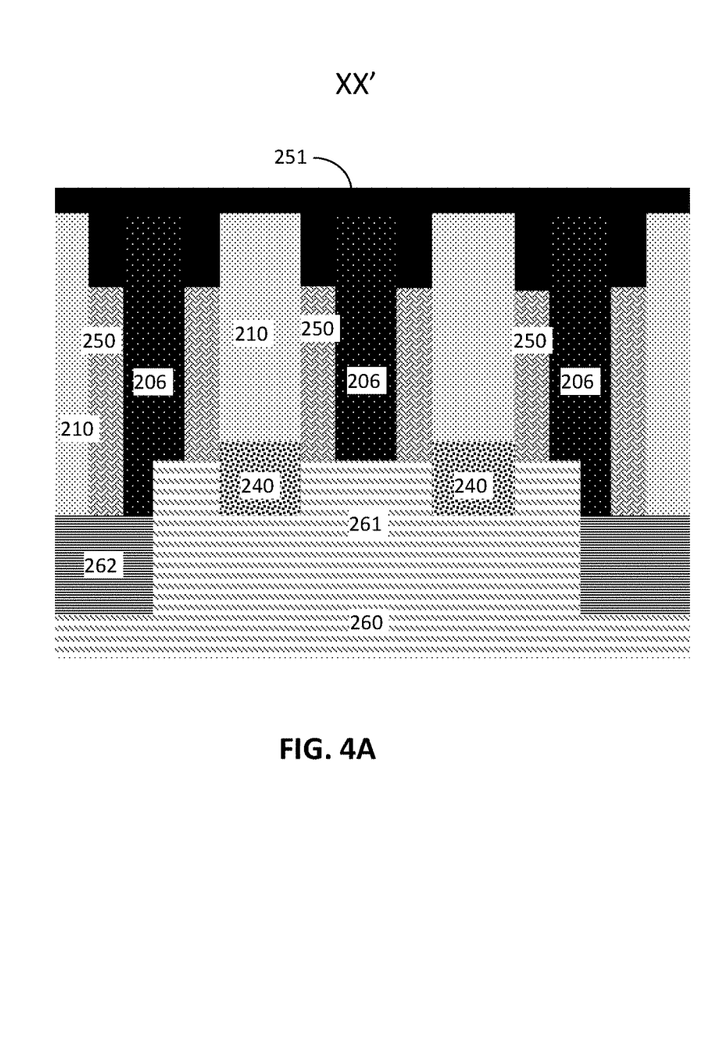
FIG. 4A is a cross-sectional side view through the XX' axis after depositing a conformal metal oxide layer to fill the gate spacer recesses.
Figure 4B:
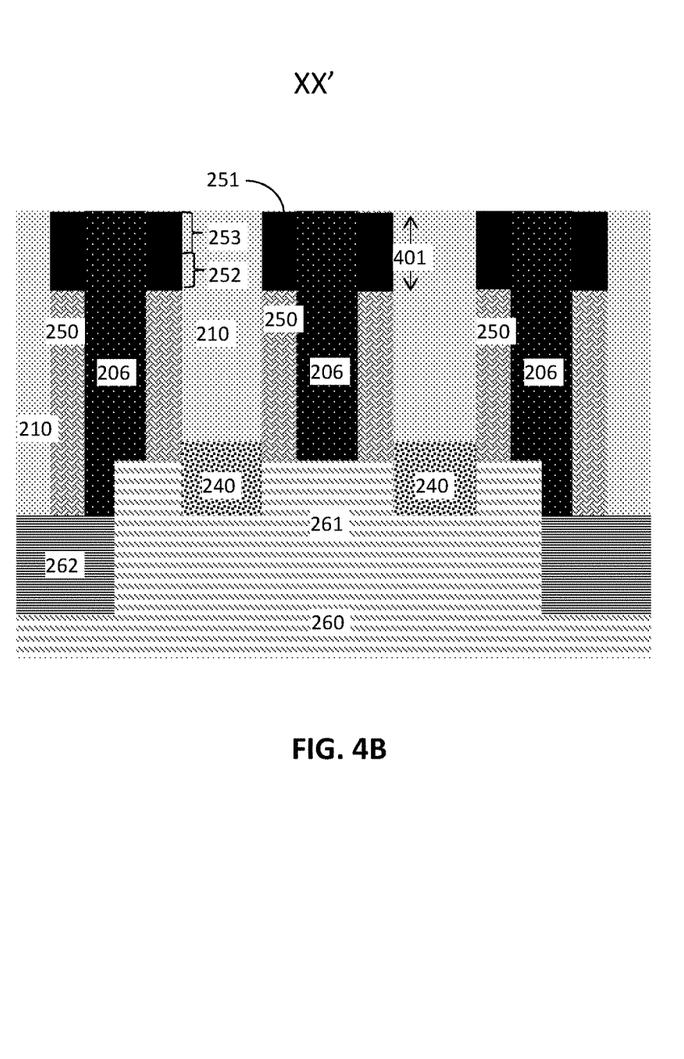
FIG. 4B is a cross-sectional side view through the XX' axis after etching back the metal oxide layer to form the spacers.

FIG. 4A is a cross-sectional side view after depositing a conformal metal oxide layer to fill the gate spacer recesses 301 and form the spacers 251, as shown in FIG. 4B below. The metal oxide material is an insulating material and may be formed by an ALD process. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

The spacers 251 can be deposited by, for example, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), or any other suitable processing.

FIG. 4B is a cross-sectional side view through the XX' axis after etching back the metal oxide layer to form the spacers 251. The spacer height 401 is defined by the spacer recesses 301 as described above in FIG. 3B. Thus, the spacer heights 401 are defined by the depth of the spacer recesses 301 shown in FIG. 3B. An isotropic etching process may be used to remove the metal oxide layer over the ILD layer 210. Isotropic etching processes are chemical etching processes that utilize a chemical etchant. Non-limiting examples of suitable isotropic etchants include hydrofluoric acid (HF), hydrofluoric nitric acid (HNA), and phosphoric acid. The spacers 251 have a first spacer portion 252 and a second spacer portion 253.

Figure 5A:
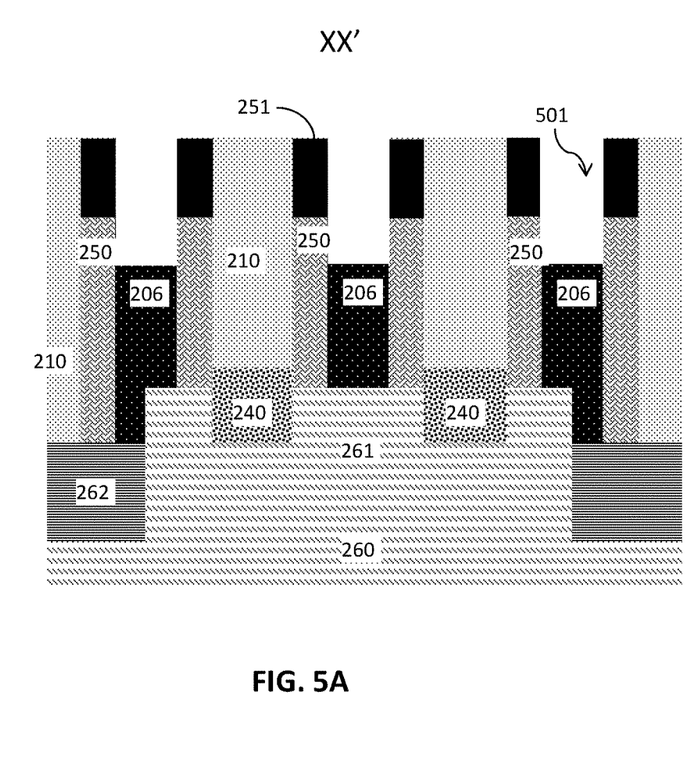
FIG. 5A is a cross-sectional side view through the XX' axis after recessing back the metal gates.

FIG. 5A is a cross-sectional side view after recessing back the metal gates 206 to form metal gate recesses 501. The metal gate recesses 501 are formed by a dry etching process, for example, RIE. The metal gates 206 are recessed to a level that is below the spacers 251. The spacer 251 is above the metal gate recesses 501.

Figure 5B:
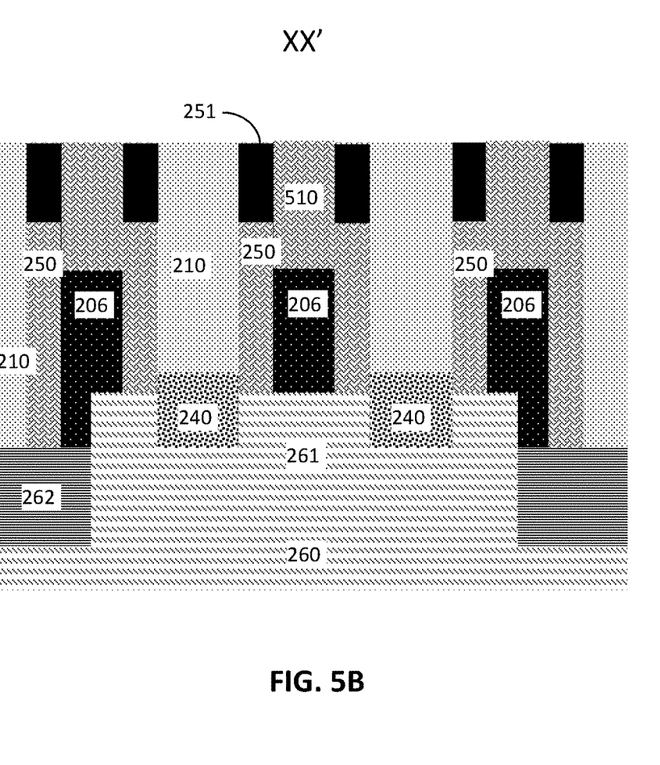
FIG. 5B is a cross-sectional side view through the XX' axis after depositing a dielectric cap over the metal gates.

FIG. 5B is a cross-sectional side view after depositing a dielectric cap 510 over the metal gates 206 and within the metal gate recesses 501. The spacers 251 enable the dielectric cap 510 to be self-aligned over the metal gates 206. At least a portion of the dielectric cap 510 is below the spacers 251. Further, at least a portion of the dielectric cap 510 is between the spacer 251 and the metal gate 206. The dielectric cap 510 may be any suitable dielectric material and may be the same or different than the dielectric spacers 250. Non-limiting examples of suitable materials for the dielectric cap 510 include SiN, SiOCN, SiBCN, or any combination thereof. A planarization process is performed to polish the surface of the dielectric cap 510.

Figure 6A:
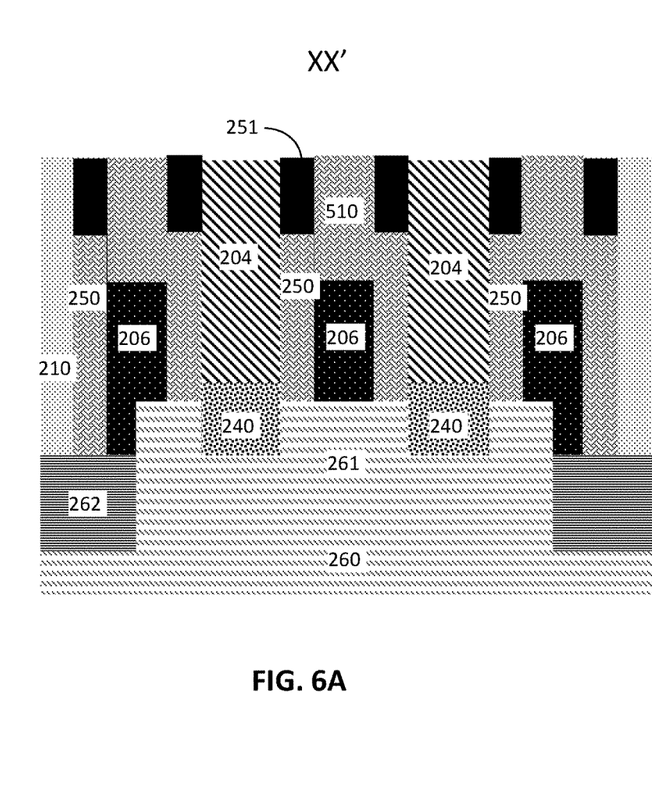
FIG. 6A is a cross-sectional side view through the XX' axis after forming source/drain contacts.

FIG. 6A is a cross-sectional side view after forming source/drain contacts 204. The ILD layer 210 material over the source/drain regions 240 is removed. A dry etching process, for example, reacting ion etching (RIE) may be used. The ILD layer 210 material is replaced with a conductive metal to form the source/drain contacts 204. Non-limiting examples of suitable conductive metals include Al, Pt, Au, W, Ti, or any combination thereof. The conductive metal may be deposited by a known deposition process, for example, CVD, PECVD, PVD, plating, thermal or e-beam evaporation, or sputtering.

Figure 6B:
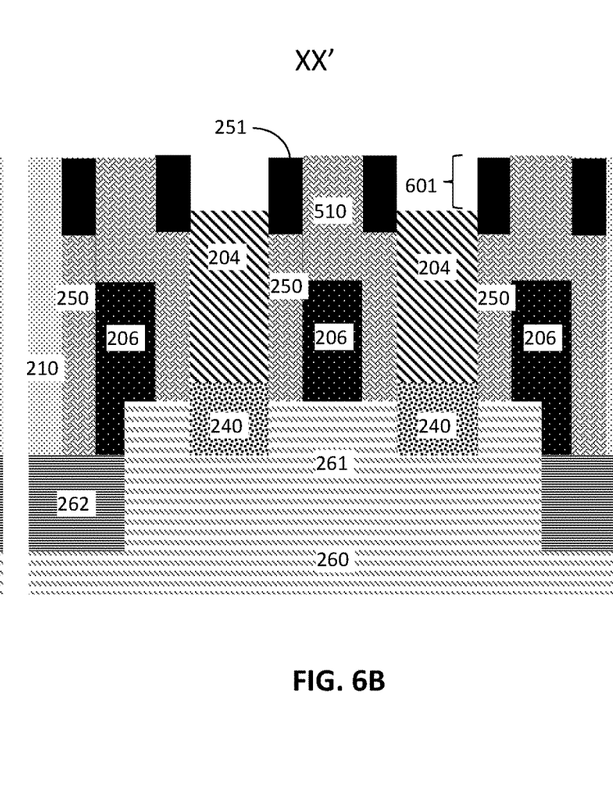
FIG. 6B is a cross-sectional side view through the XX' axis after recessing back the source/drain contacts.

FIG. 6B is a cross-sectional side view after recessing back the source/drain contacts 204. The recessing is performed by a dry etching process, for example, RIE. The source/drain contacts 204 are recessed to a shallow depth 601 that may generally vary. In one aspect, the shallow depth 601 is in a range from about 5 nm to about 40 nm. In another aspect, the shallow depth 601 is in a range from about 15 nm to about 30 nm.

Figure 7:
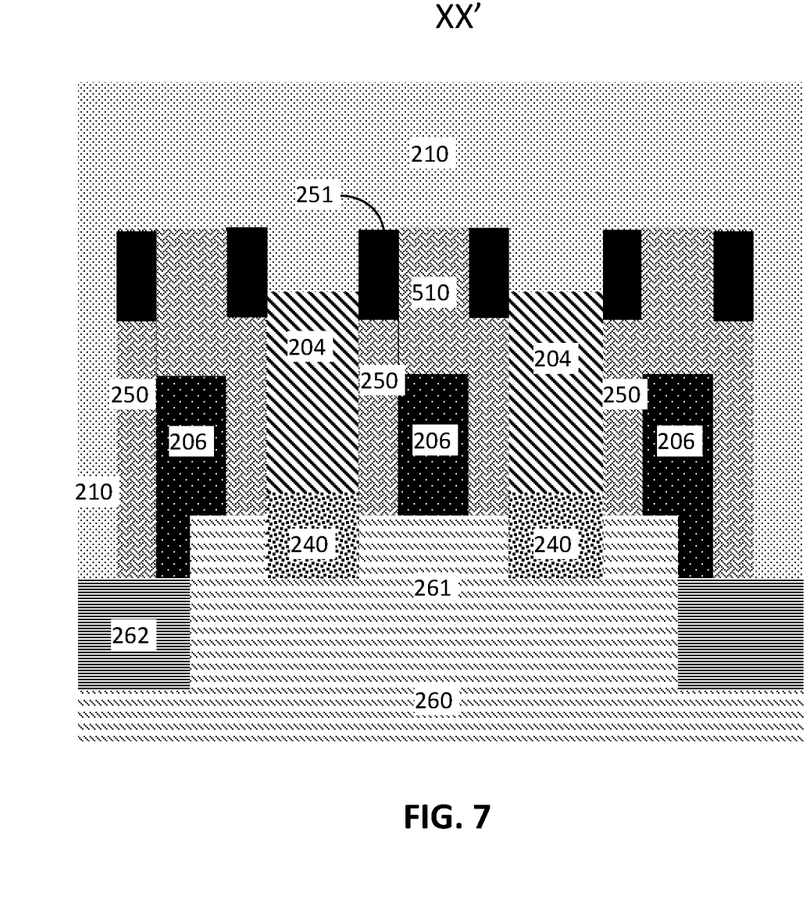
FIG. 7 is a cross-sectional side view through the XX' axis after depositing a blanket inter-level dielectric (ILD) oxide layer.

FIG. 7 is a cross-sectional side view after depositing an additional blanket ILD layer 210. The additional blanket oxide layer 210 may be the same (shown) or different (not shown) than the ILD layer 210 that used after forming the dummy gates (see FIGS. 3A and 3B above).

Figure 8A:
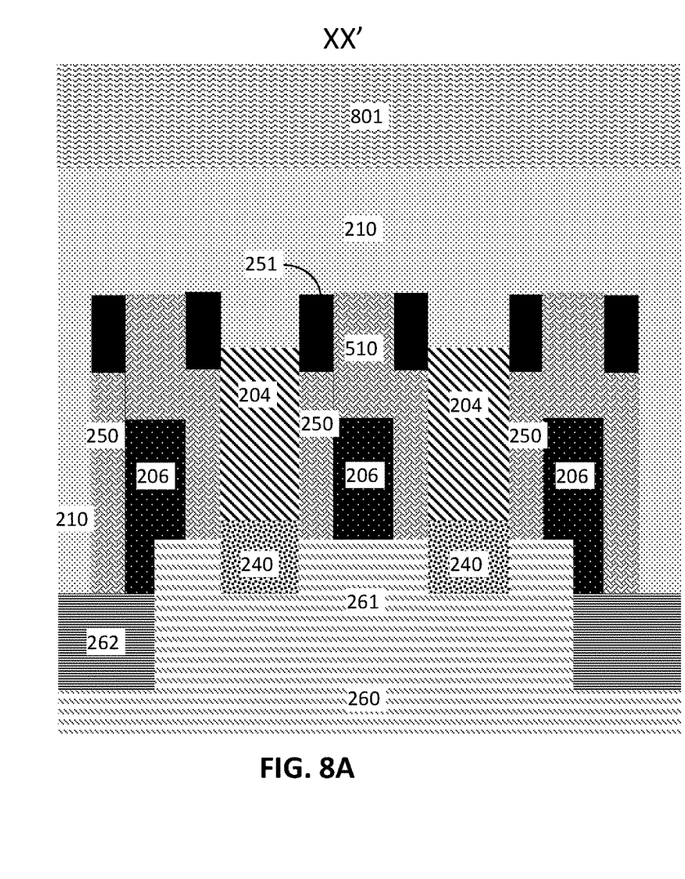
FIGS. 8A and 8B are cross-sectional side views through the XX' and YY' axes, respectively, of FIG. 2A, after depositing and patterning a lithographic patterning layer.
Figure 8B:
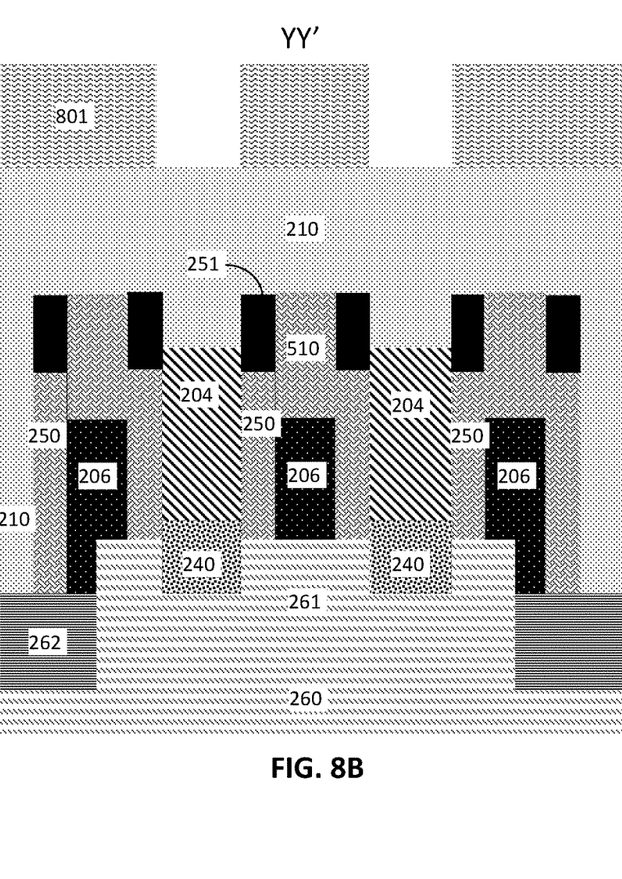

FIGS. 8A and 8B are cross-sectional side views through the XX' and YY' axes, respectively, of FIG. 2A after depositing and patterning a lithographic patterning layer 801 over the structure formed in FIG. 7. The lithographic patterning layer 801 may be a stack or a single layer. For example, the lithographic patterning layer 801 may be an organic planarizing layer (OPL) or a photoresist. The lithographic patterning layer 801 is patterned over the source/drain contacts 204 as shown in FIG. 8B.

Figure 9A:
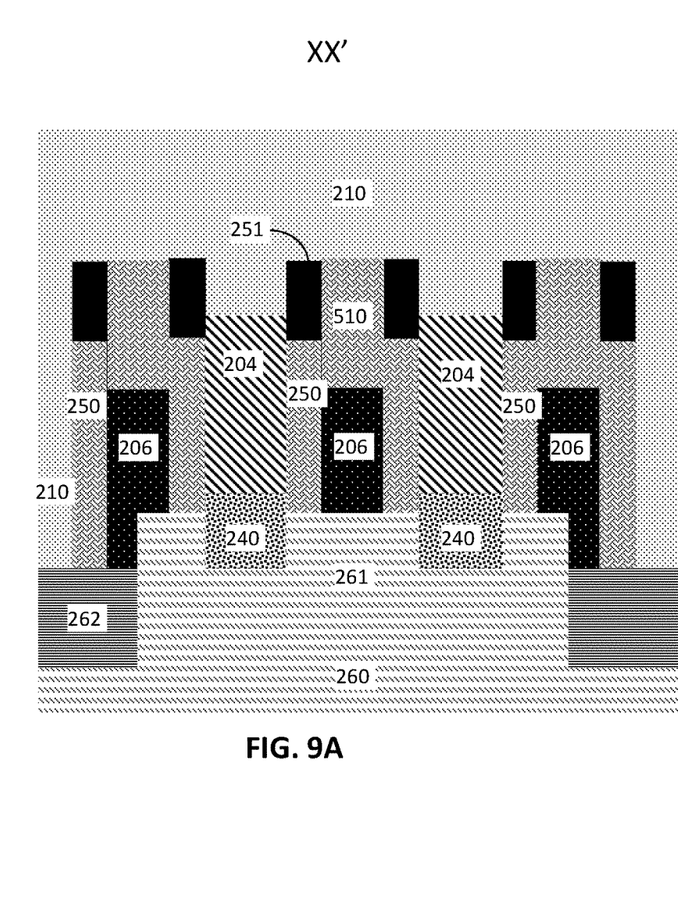
FIGS. 9A and 9B are cross-sectional side views through the XX' and YY' axes, respectively, after etching through the ILD layer to form a via contact pattern.
Figure 9B:
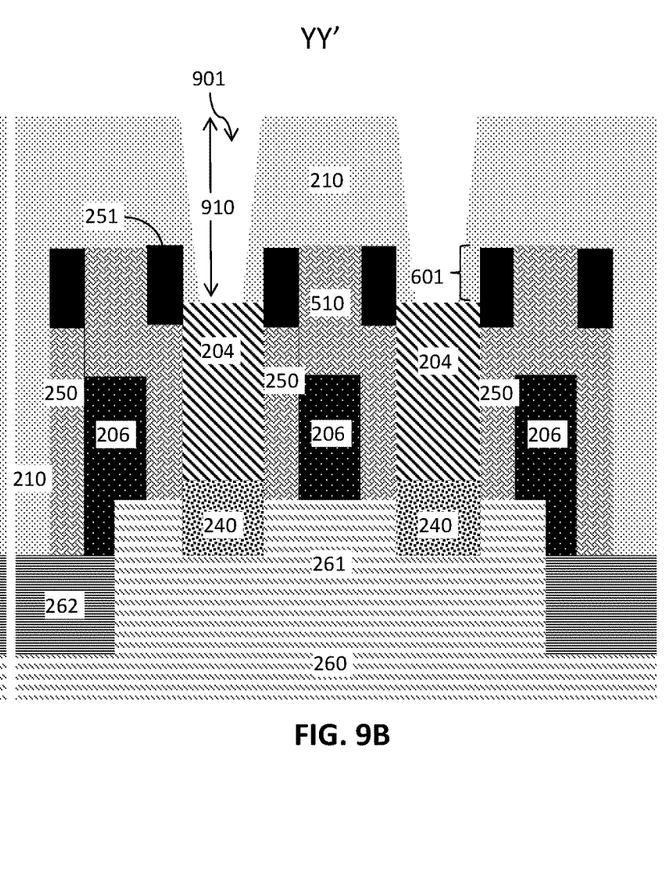

FIGS. 9A and 9B are cross-sectional side views through the XX' and YY' axes, respectively, after etching the pattern through the ILD layer 210 to form a via contact pattern 901. Etching is performed down to the source/drain contacts 204. The etching process may a dry etching process, for example, RIE. Because the source/drain contacts 204 are recessed to the shallow depth 601, the via contact patterns 901 defining the via contacts 202 (described in FIG. 13B below) have a shorter depth 910 to reach the source/drain contacts 204. In one aspect, the depth 910 of the via contact patterns 901 is in a range from about 30 nm to about 150 nm. In another aspect, the depth 910 of the via contact patterns 901 is in a range from about 50 nm to about 80 nm.

Figure 10A:
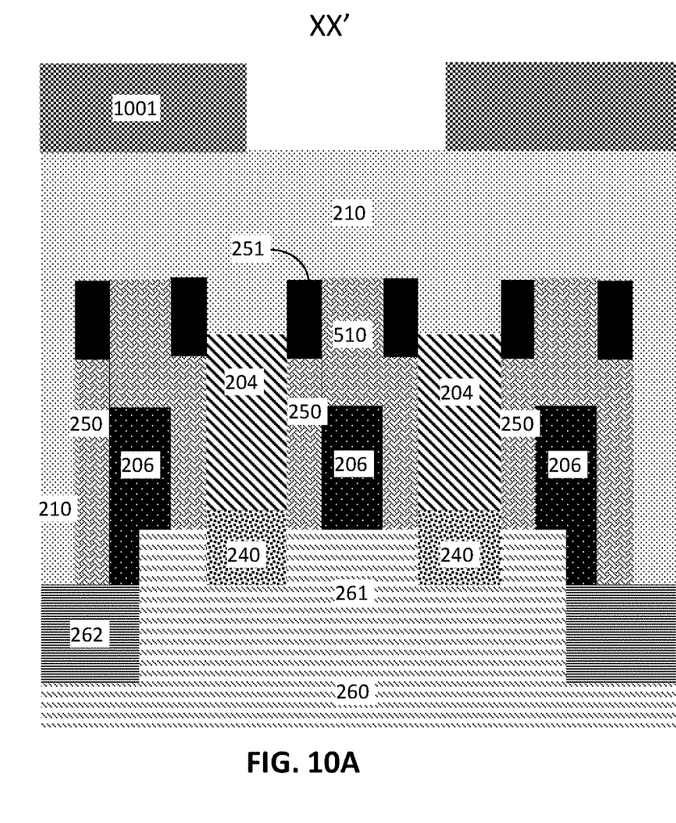
FIGS. 10A and 10B are cross-sectional side views through the XX' and YY' axes, respectively, after depositing and patterning another lithographic patterning stack.
Figure 10B:
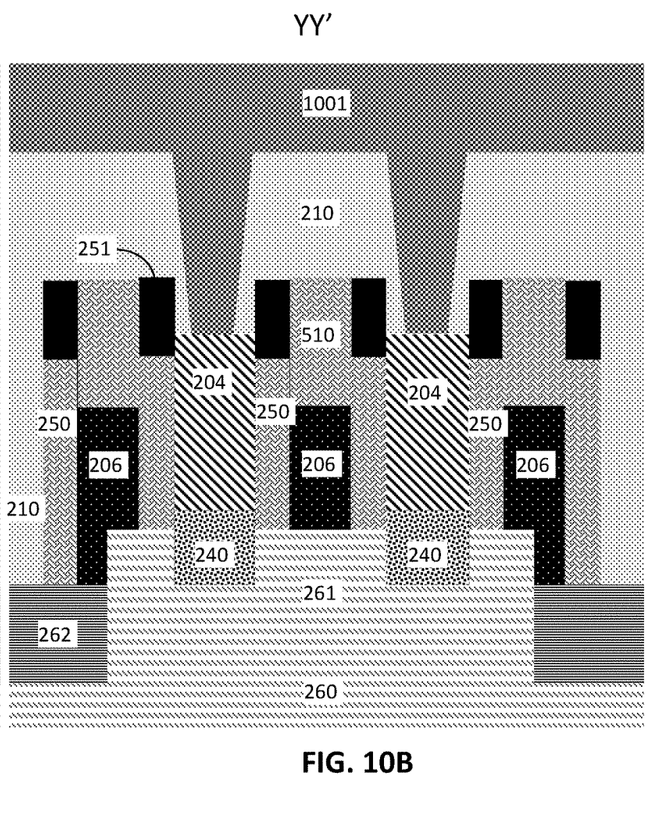

FIGS. 10A and 10B are cross-sectional side views through the XX' and YY' axes, respectively, after depositing and patterning another lithographic patterning layer 1001. The lithographic patterning layer 901 may be a stack or a single layer. For example, the lithographic patterning layer 901 may be an OPL or a photoresist. The lithographic patterning layer 901 is patterned over the metal gate 206 as shown in FIG. 10A.

Figure 11A:
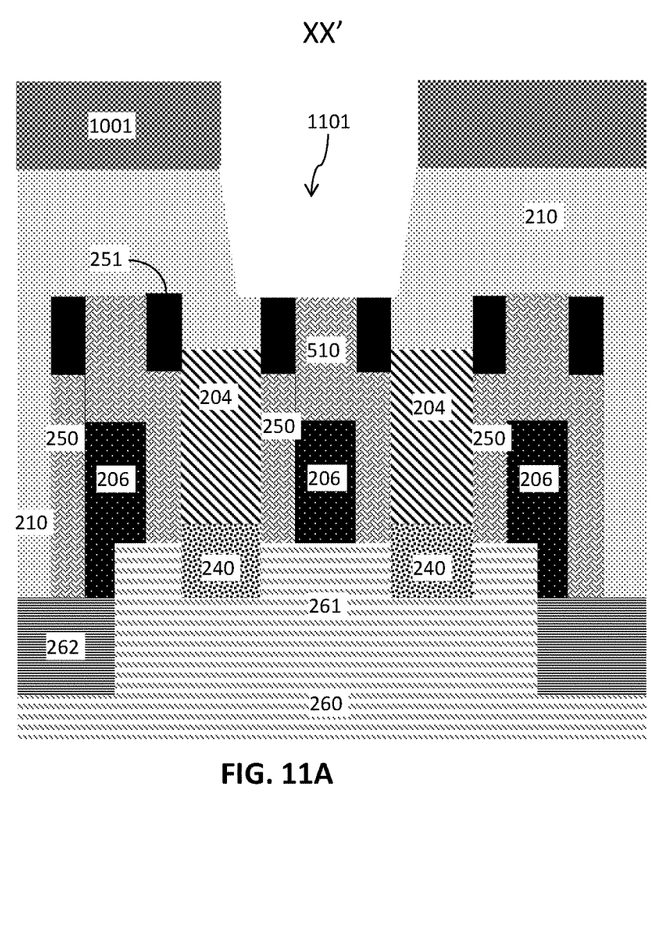
FIGS. 11A and 11B are cross-sectional side views through the XX' and YY' axes, respectively, after etching through the ILD layer to form a gate contact pattern.
Figure 11B:
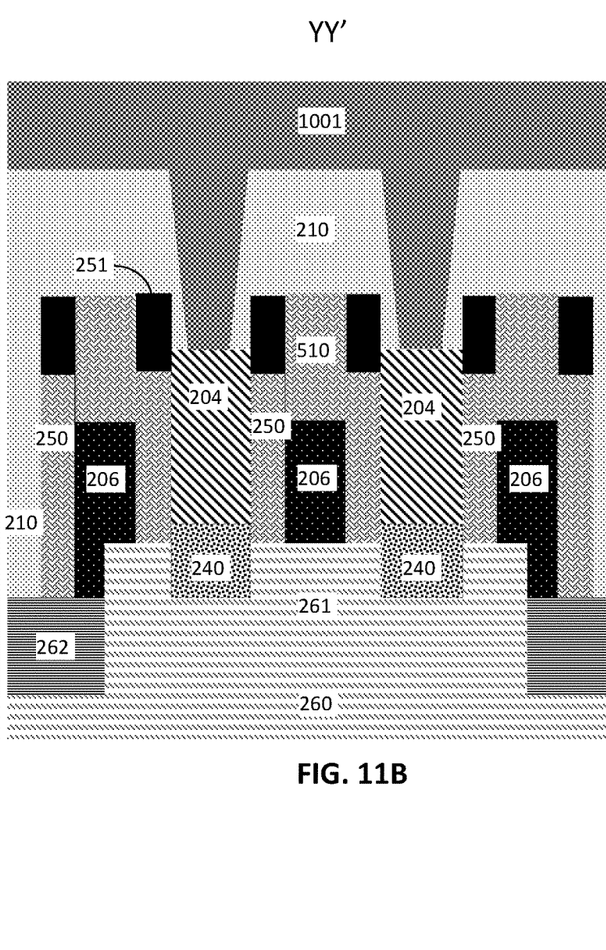

FIGS. 11A and 11B are cross-sectional side views through the XX' and YY' axes, respectively, after etching through the ILD layer 210 to form an initial gate contact pattern 1101. A timed dry etching process, for example, RIE is performed to etch through the ILD layer 210 down to the level of the dielectric cap 510. The etching process is timed to not penetrate the dielectric cap 510 or the spacers 251. The etching process is a selective etching process. In some embodiments, the ILD 210 is silicon oxide, the dielectric cap 510 is silicon nitride, and the spacers 251 are hafnium oxide or aluminum oxide.

Figure 12A:
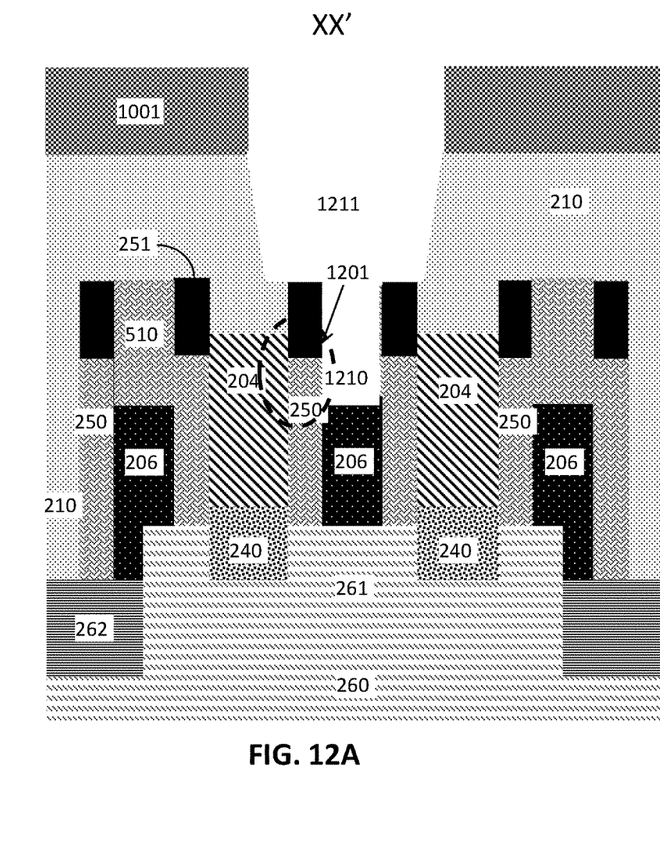
FIGS. 12A and 12B are cross-sectional side views through the XX' and YY' axes, respectively, after removing the dielectric cap over the gates.
Figure 12B:
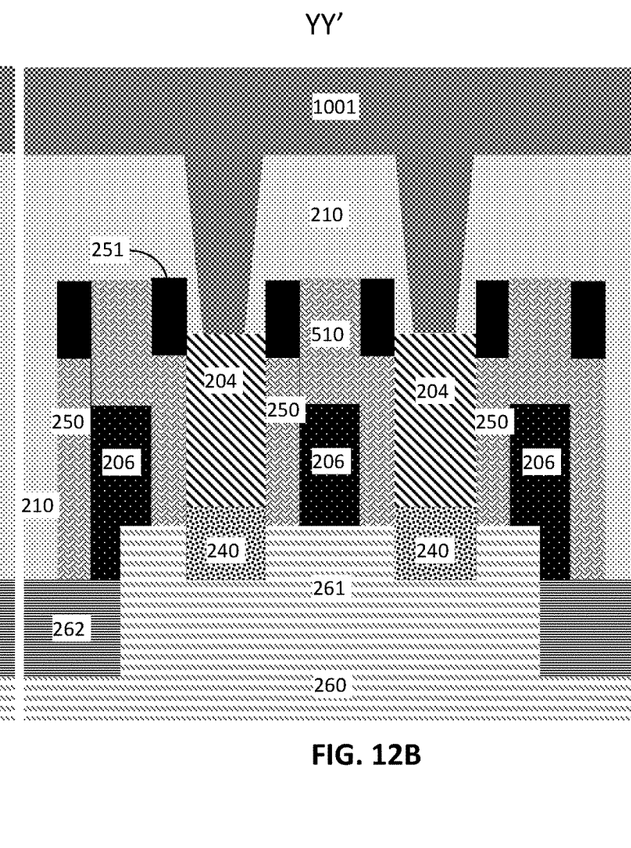

FIGS. 12A and 12B are cross-sectional side views through the XX' and YY' axes, respectively, after selectively removing the dielectric cap 510 over the metal gate 206 to form a final gate contact pattern 1211. A dry etching process, for example, ME, that is selective to (will not penetrate) the spacer 251 material or the ILD layer 210 material is performed to remove the dielectric cap 510 material. The region 1201 shows that the spacer 251 provides sufficient space between the region directly over the metal gate 206 (which will be the gate contact 203 (see FIG. 13A)) and the source/drain contact 204 to prevent shorting.

The gate contact pattern 1211 includes a first gate contact portion 1210 and a second gate contact portion 1211. The first gate contact portion 1210 is directly over and contacts the metal gate 206. The second gate contact portion 1211 is over the first gate contact portion 1210. The second gate contact portion 1211 is wider than the first gate contact portion 1210. At least a portion of the second gate contact portion 1211 is directly over at least one spacer 251.

Figure 13A:
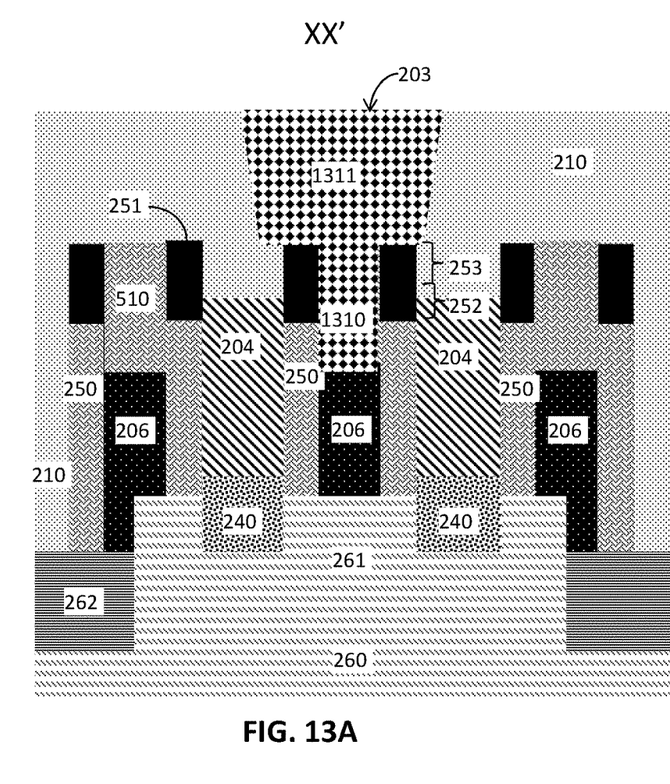
FIGS. 13A and 13B are cross-sectional side views through the XX' and YY' axes, respectively, after removing the patterning stack and filling the gate contact and the via contacts with a conductive metal.
Figure 13B:
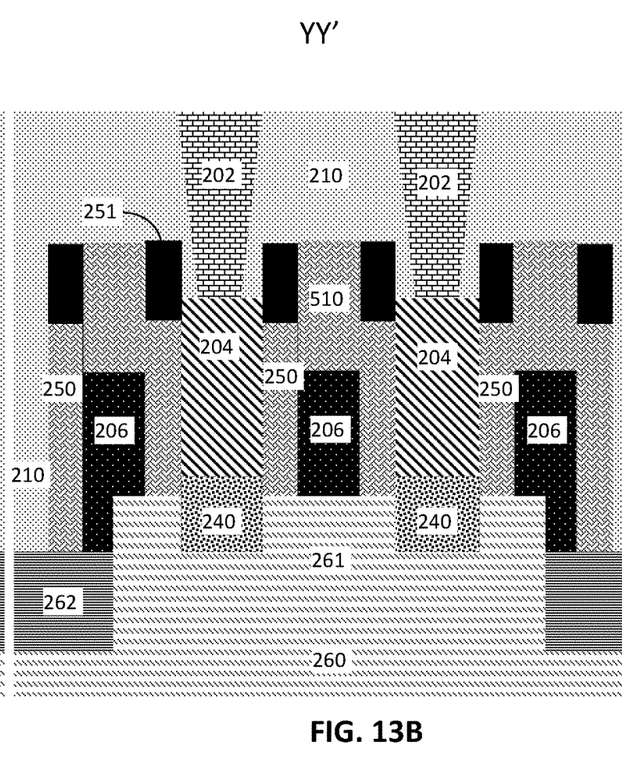

FIGS. 13A and 13B are cross-sectional side views through the XX' and YY' axes, respectively, after removing the patterning stack 901 and filling with a conductive metal to form the gate contact 203 and the via contacts 202. The conductive metal may be the same or different for the gate contact 203 and the via contacts 202. Non-limiting examples of suitable conductive metals include Al, Pt, Au, W, Ti, or any combination thereof. At least a portion of the via contacts 202 is more narrow than the source/drain contacts 204.

The gate contact 203 includes a first gate contact portion 1310 and a second gate contact portion 1311. The first gate contact portion 1310 is directly over and contacts the metal gate 206. The second gate contact portion 1311 is over the first gate contact portion 1310. The second gate contact portion 1311 is wider than the first gate contact portion 1310. At least a portion of the second gate contact portion 1311 is directly over at least one of the spacers 251.

The spacer 251 is between the source/drain contact 204 and the gate contact 203. The first spacer portion 252 isolates the first gate contact portion 1310 from the source/drain contact 204. The second spacer portion 253 isolates the second gate contact portion 1311 from the source/drain contact.

As described above, embodiments of the present invention provide methods of making semiconductor devices with gate contacts over active areas using shallow source/drain contacts. Shallow source/drain contacts enable accessible via contact alignment. The gate contact is isolated from the source/drain contacts by a spacer with two portions. A first portion isolates the gate conductor from the source/drain contact, and a second portion isolates the gate contact from the source/drain contact. Embodiments of the inventive semiconductor devices and methods provide advantages of providing gate contacts over active areas that avoid gate contact to source/drain contact shorting and allow for easier via contact formation over the source/drain contact.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device, the method comprising:
    patterning a fin in a substrate;
    forming a gate between source/drain regions over the substrate, the gate having a dielectric spacer along a sidewall;
    removing a portion of the dielectric spacer and filling with a metal oxide to form a spacer, the spacer having a first spacer portion and a second spacer portion;
    recessing the gate and depositing a dielectric cap over the gate;
    forming a source/drain contact over at least one of the source/drain regions, the source/drain contact contacting the spacer and the dielectric spacer;
    forming a via contact over the source/drain contact; and
    removing the dielectric cap and forming a gate contact over the gate, the gate contact having a first gate contact portion contacting the gate and a second gate contact portion positioned over the first gate contact portion, the second gate contact portion being wider than the first gate contact portion;
    wherein the first spacer portion and the second spacer portion comprise different materials, the first spacer portion lines sidewalls of the gate and extends to a height that is over the gate, and directly contacts the first gate contact portion and the source/drain contact, and the second spacer portion is arranged directly on top of the first spacer portion, directly beneath an overhanging portion of the second gate contact portion, and directly in contact with the source/drain contact.

2. The method of claim 1, wherein the spacer is over a portion of the dielectric cap.

3. The method of claim 1, further comprising recessing the source/drain contact to form a recess before forming the via contact to a depth in a range from about 30 nanometers (nm) to about 150 nm to form a source/drain recess.

4. The method of claim 3, further comprising depositing an oxide layer to fill the recess, patterning the oxide layer to form a via contact pattern over the source/drain contact, and filling the via contact pattern with a conductive metal to form the via contact.

5. The method of claim 1, further comprising depositing an oxide layer over the gate, patterning the oxide layer to form a gate contact pattern, and filling the gate contact pattern with a conductive metal to form the gate contact.

6. The method of claim 1, wherein filling with the metal oxide to form the spacer is by an atomic layer deposition process.

7. The method of claim 1, wherein the metal oxide is $HfO_2$.

8. The method of claim 1, wherein the metal oxide is $Al_2O_3$.

9. The method of claim 1, wherein the gate contact comprises Al, Pt, Au, W, Ti, or any combination thereof.

10. The method of claim 1, wherein the spacer has a height in a range from about 5 to about 70 nm.

* * * * *